United States Patent [19]

Choi et al.

[11] Patent Number: 4,962,481

[45] Date of Patent: Oct. 9, 1990

[54] EEPROM DEVICE WITH PLURALITY OF MEMORY STRINGS MADE OF FLOATING GATE TRANSISTORS CONNECTED IN SERIES

[75] Inventors: Jung-Hyuk Choi; Soo-Chul Lee; Hyung-Kyu Yim, all of Seoul, Rep. of Korea

[73] Assignee: SamSung Electronics Co., Ltd., Suweon, Rep. of Korea

[21] Appl. No.: 292,107

[22] Filed: Dec. 30, 1988

[51] Int. Cl.$^5$ ............................................. G11C 11/40
[52] U.S. Cl. .................................. 365/185; 365/184; 365/218; 357/23.5
[58] Field of Search ...................... 365/94, 103–104, 365/185, 184, 186, 187, 238.5, 218; 307/465; 357/23.5; 340/825.8, 825.9

[56] References Cited

U.S. PATENT DOCUMENTS

| | | |
|---|---|---|
| 4,203,158 | 5/1980 | Frohman-Bentchkowsky et al. ........................................ 365/185 |
| 4,233,526 | 11/1980 | Kurogi et al. ..................... 357/23.5 |
| 4,467,453 | 8/1984 | Chiu et al. ............................. 365/185 |
| 4,500,975 | 2/1985 | Shirato ................................. 365/104 |
| 4,580,247 | 4/1986 | Adam .................................. 365/185 |
| 4,648,074 | 3/1987 | Pollachek ....................... 365/184 X |

FOREIGN PATENT DOCUMENTS

| | | |
|---|---|---|
| 53-148256 | 12/1978 | Japan . |
| 57-71587 | 5/1982 | Japan . |
| 60-8559 | 3/1985 | Japan . |
| 60-82162 | 9/1985 | Japan .................................. 365/185 |
| WO8402800 | 7/1984 | PCT Int'l Appl. . |

OTHER PUBLICATIONS

Symoposium on VLSI Technology, May 1986, pp.–89 –90, "A High Density EPROM Cell and Array" by Stewart et al., Digest of Tech. Papers.
IBM Technical Disclosure Bulletin, vol. 24, No. 7B, Dec. 81, pp. 3811–3812 "Electrically Alterable Non-Volatile Logic Circuits" by Kotecha.
Symposium on VLSI Circuit, Digest of Technical Papers, 1988 VLSI Research Center, Toshiba Corp., pp. 33–34, "A New Cell for Ultra High Density 5V-only EEPROMs" by Shirota et al.

Primary Examiner—Stuart N. Hecker
Assistant Examiner—Alfonso Garcia
Attorney, Agent, or Firm—Levy, Bushnell, Zito & Grandinetti

[57] ABSTRACT

An electrically erasable programmable semiconductor memory array for high density including a plurality of column lines; a plurality of reference lines perpendicular to the column lines; a plurality of memory strings arranged in two columns at both sides of each column line and in upper and lower rows between the reference lines, each of upper and lower memory strings at one side of each column including a first transistor and a plurality of floating gate transistors, each of upper and lower memory strings at the other side of each column including a second transistor and a plurality of floating gate transistors, drain-source paths of the first or second transistor and the floating gate transistors in each memory string being connected in series, the first and second transistors and the floating gate transistors being arranged in an array of rows and columns, gates of the first and second transistors and the floating gate transistors in the upper memory strings and the first and second transistors and the floating gate transistors in the lower memory strings being respectively connected to first and second select lines, each other upper word lines, third and fourth select lines and each other lower word lines. The drains of the first and second transistors are connected to the column line through a single contact hole; the other ends of the serial connections in the upper memory strings are connected to the reference line adjacent thereto; and means for connecting the other ends of the serial connections in the lower memory strings to the reference line adjacent thereto.

21 Claims, 7 Drawing Sheets

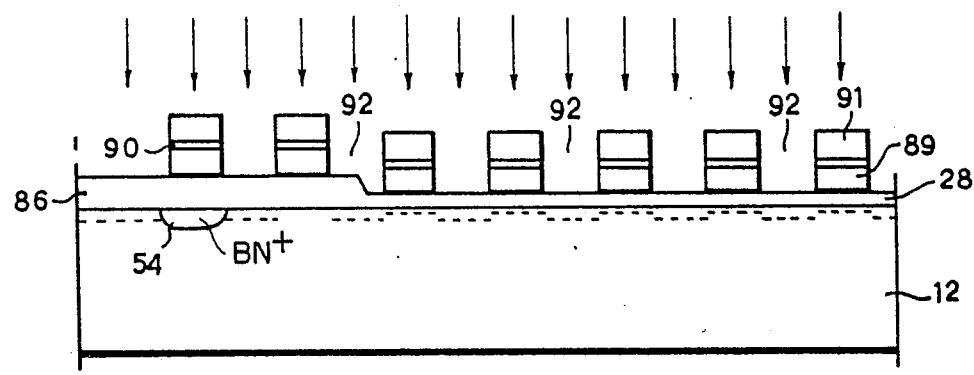
F I G. 5e
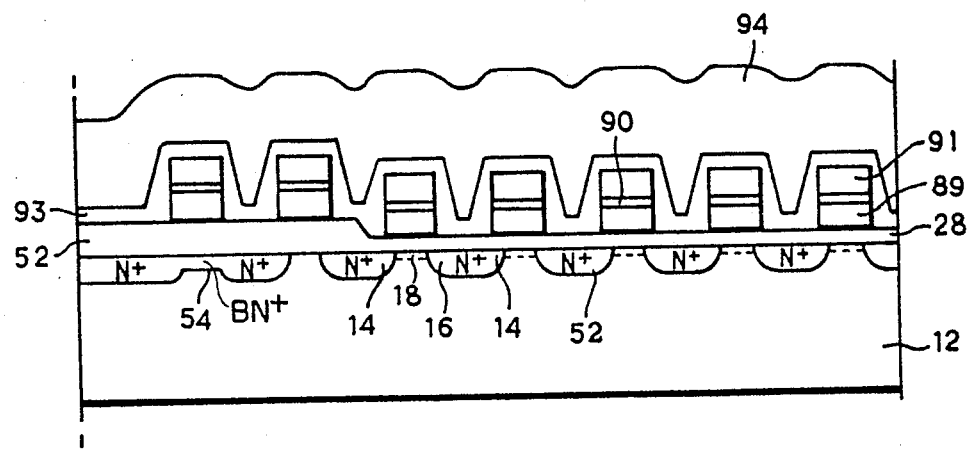
F I G. 5f

EEPROM DEVICE WITH PLURALITY OF MEMORY STRINGS MADE OF FLOATING GATE TRANSISTORS CONNECTED IN SERIES

FIELD OF THE INVENTION

The present invention relates to an electrically erasable programmable semiconductor memory device, and particularly to an electrically erasable programmable semiconductor memory device having NAND cells.

BACKGROUND OF THE INVENTION

In electrically erasable and programmable read only memory (EEPROM) devices, the most widely used floating gate EEPROM cell may erase and program data by utilizing Fowler-Nordheim (F-N) tunnelling of electrons through a thin gate oxide. One bit of such prior-art EEPROM cells is composed of a select transistor for selecting the bit according to input address and a sense transistor having a floating gate for attracting or extracting electrons thereto or therefrom according to a program (or write) or an erase mode upon selection of the bit. Prior EEPROM devices having such EEPROM cells have advantages capable of performing program, erase and read operations in byte (8 bits) and using with a single +5 volts power supply. However, since the EEPROM cell employs two transistors per bit, employing such cells in high density EEPROR devices is undesirable for the scaling-down of chip.

To solve such problem, EEPROM device with NAND cells (hereinafter referred to as memory strings) is disclosed in 1988 SYMPOSIUM ON VLSI CIRCUIT. DIGEST OF TECHNICAL PAPERS, pages 33-34. FIG. 1 shows a portion of an equivalent circuit for a memory array of cells of the EEPROM device with memory strings. The memory array 10 comprises a plurality of bit lines BL1, BL2, . . . , represented by parallel column lines, and a plurality of memory strings MS11, MS12, . . . which are arranged in a matrix form of mutually parallel rows and columns and coupled between each bit line and ground. Each of memory strings is composed of a string select MOS transistor ST whose drain is coupled to the corresponding bit line, a ground select MOS transistor GT whose source is coupled to ground and 8-bit floating gate MOS transistors MC1 to MC8 whose drain-source paths are coupled in series between the source of the transistor ST and the drain of the transistor GT. Gates of transistors ST, each control gate of floating gate transistors MC1 to MC8 and gates of transistors GT are respectively coupled to a string select lins SSL1, word lines WL11 to WL18 and ground select line GSL1 which are parallel lines in rows.

Operation modes of the EEPROM device will be described with reference to FIG. 1.

Erase operation is of a flash erase which is simultaneously erasing data of whole memory cells. Such flash erase may be carried out by applying 5 volts to string and ground select lines SSL1 and GSL1 to turn on transistors ST and GT, applying an erase voltage of 13 volts to all word lines WL11 to WL18 and grounding all bit lines BL1, BL2, . . . . By the application of such voltages, each floating gate transistor is erased to an enhancement mode MOS transistor by F-N tunnelling of electrons from its drain to its floating gate.

Program operation may be performed for each word line after the flash erase. For example, explanation will be made for programming a memory cell MC4 in the memory string MS11. The programming of the memory cell MC4 may be achieved by applying a pass voltage of 20 volts to the string select line SSL1 as well as unselected word lines WL11 to WL13 between the string select line SSL1 and the selected word line WL14 (pass word lines), applying ground (0 volt) to word lines WL14 to WL18 and the ground select line GSL1, and applying a program voltage of 20 volts to the bit line BL1. The program voltage on the bit line BL1 is transferred to the drain of the selected transistor MC4 through the string select MOS transistor ST and transistors MC1 to MC3 which are all turned on in the memory string MS11. Then, the transistor MC4 is programmed to a depletion mode floating gate MOS transistor by F-N tunnelling of electrons from its floating gate to its drain.

Read operation of a memory cell MC4 in the memory string MS11 may be performed by applying ground to a selected word line WL14 and applying 5 volts to string and ground select lines SSL1 and GSL1, all unselected word lines WL11 to WL13 and WL15 to WL18, and the bit line BL1. When the memory cell MC4 was erased as enhancement mode transistor, there will be no current flowing on the bit line BL1 because of OFF-state of the memory cell MC4. Alternatively, when the memory cell MC4 was programmed as depletion mode transistor, current flowing on the bit line BL1 will be present because of ON-state of the memory cell MC4. Therefore, a sense amplifier coupled to the bit line BL1 may read out data in the selected memory cell MC4 by detecting the current flowing on the bit line BL1.

This EEPROM device has the following disadvantages. Since the pass voltage (20 volts), which is, during a program operation, applied to control gates of memory cells coupled to the pass word lines for transferring the program voltage (20 volts) on the selected bit line to the drain of the selected memory cell, is even higher than the erase voltage (13 volts) required for erasing all memory cells during an erase operation, all memory cells associated with pass word lines and unselected bit lines may be either automatically erased or over-erased. Therefore, disturbance of memory cells may be occurred.

Another problem is to require a contact area with large size to interconnect between each memory string and the corresponding bit line. Under the location of memory strings underneath bit lines, each contact area occupying a large area gives limit to the scaling-down of memory cells in the row direction. Therefore, the scaling down of the memory array is restricted.

SUMMARY OF THE INVENTION

Accordingly, it is an object of the present invention to provide a memory array having memory strings which is suitable for high density EEPROM devices.

It is another object of the present invention to provide an EEPROM device capable of preventing a disturbance of memory cells.

In accordance with one embodiment of the present invention, an electrically erasable programmable semiconductor memory array comprises:
  a plurality of column lines;
  a plurality of reference lines perpendicular to the column lines;
  a plurality of memory strings arranged in a single column respectively disposed at both sides of each column line and in an upper and a lower row disposed between each adjacent reference lines, each of upper and lower memory strings at one side of each column including a first transistor having a drain, a source and a gate and a plurality of floating gate transistors each having a drain, a source, a floating gate and a control gate, drain-source paths of the first transistor and the floating gate transistors being connected in series, each of upper and lower memory strings at the other side of the column including a second transistor having a drain, a source and a gate and a plurality fo floating gate transistors, drain-source paths of the second transistor and the floating gate transistors being connected in series, the first and second transistors and the floating gate transistors being arranged in an array of rows and columns, gated of the first and second transistors and the floating gate transistors in the upper memory strings and the first and second transistors and the floating gate transistors in the lower memory strings being respectively connected to first and second selecte lines, each other upper word lines, third and fourth select lines and each other lower word lines;

means for connecting drains of the first and second transistors to the column line through a single contact hole;

means for connecting the other ends of the serial connections in the upper memory strings to the reference line adjacent thereto; and means for connecting the other ends of the serial connections in the lower memory strings to the reference line adjacent thereto.

In accordance with another embodiment of the present invention, a method of erasing all floating gate MOS transistors in a selected word line in a memory array having a plurality of memory strings arranged in rows and columns, each memory string having a first MOS transistor and a plurality of floating gate MOS transistors whose drain-source paths are connected in series between the source of the first transistor and a reference line, the drain of the first transistor being connected to the corresponding column line, gates of the first transistors in memory strings in each same row being connected to a first line, control gates of the floating gate transistors in each row in the memory strings being connected to a word line, comprises the steps of:

grounding all of column lines;

applying power supply voltage of the first line and unselected word lines in selected memory strings containing the selected word line;

applying an erase voltage to the selected word line; and floating a selected reference line in the selected memory strings.

In accordance with still another embodiment of the present invention, a method of programming a selected floating gate MOS transistors in a memory array having a plurality of memory strings arranged in rows and columns, each memory string having a first MOS transistor and a plurality of floating gate MOS transistors whose drain-source paths are connected in series between the source of the first transistor and a reference line, the drain of the first transistor being connected to the corresponding column line, gates of the first transistors in memory strings in each same row being connected to a first line, control gates of the floating gate transistors in each row in the memory strings being connected to a word line, comprises the steps of:

applying a program voltage to a selected column line;

applying a pass voltage to a selected first line in memory strings containing the selected floating gate transistor;

applying a reference source voltage to a selected word line connected to the selected floating gate transistor; and applying the pass voltage to unselected word line(s) between the selected first line and the selected word line wherein the pass voltage causes the selected first transistor and floating gate transistor(s) coupled to the selected column line and the unselected word line(s) to turn on and is lower than the program voltage, although higher than the power supply voltage.

Also, an erase inhibit voltage is applied to unselected bit lines to prevent the disturbance to cells and the power supply voltage is applied to unselected word lines between the selected word line and the reference line.

BRIEF DESCRIPTION OF THE DRAWINGS

FIG. 5a through FIG. 5f are cross-sectional views taken along a line a—a' of FIG. 3 which shows various processing steps of manufacturing the memory array of the present invention.

DETAILED DESCRIPTION OF THE INVENTION

A preferred embodiment of the present invention will now be described with reference to the accompanying drawings, by way of example.

Figure 1:
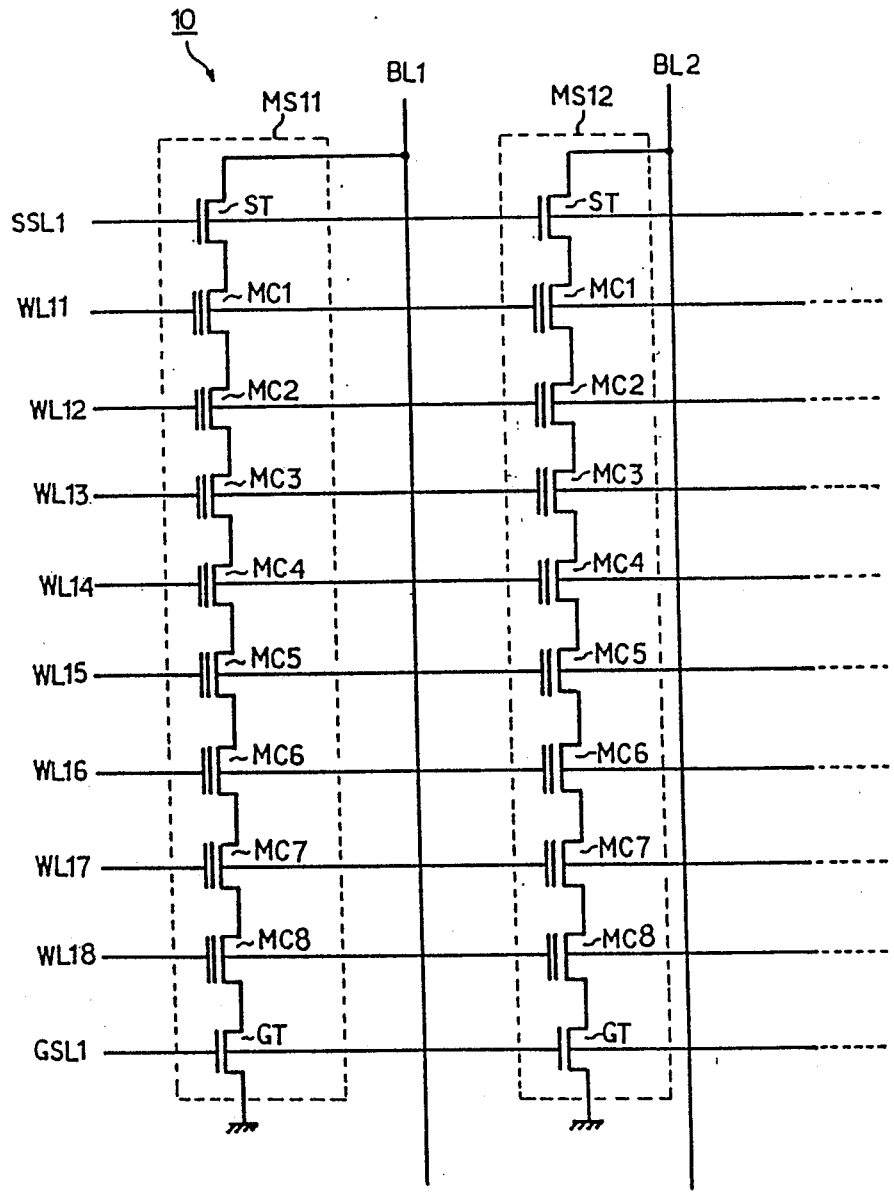
FIG. 1 is a schematic circuit diagram of a memory array of cells of the prior EEPROM device having NAND cells.
Figure 2:
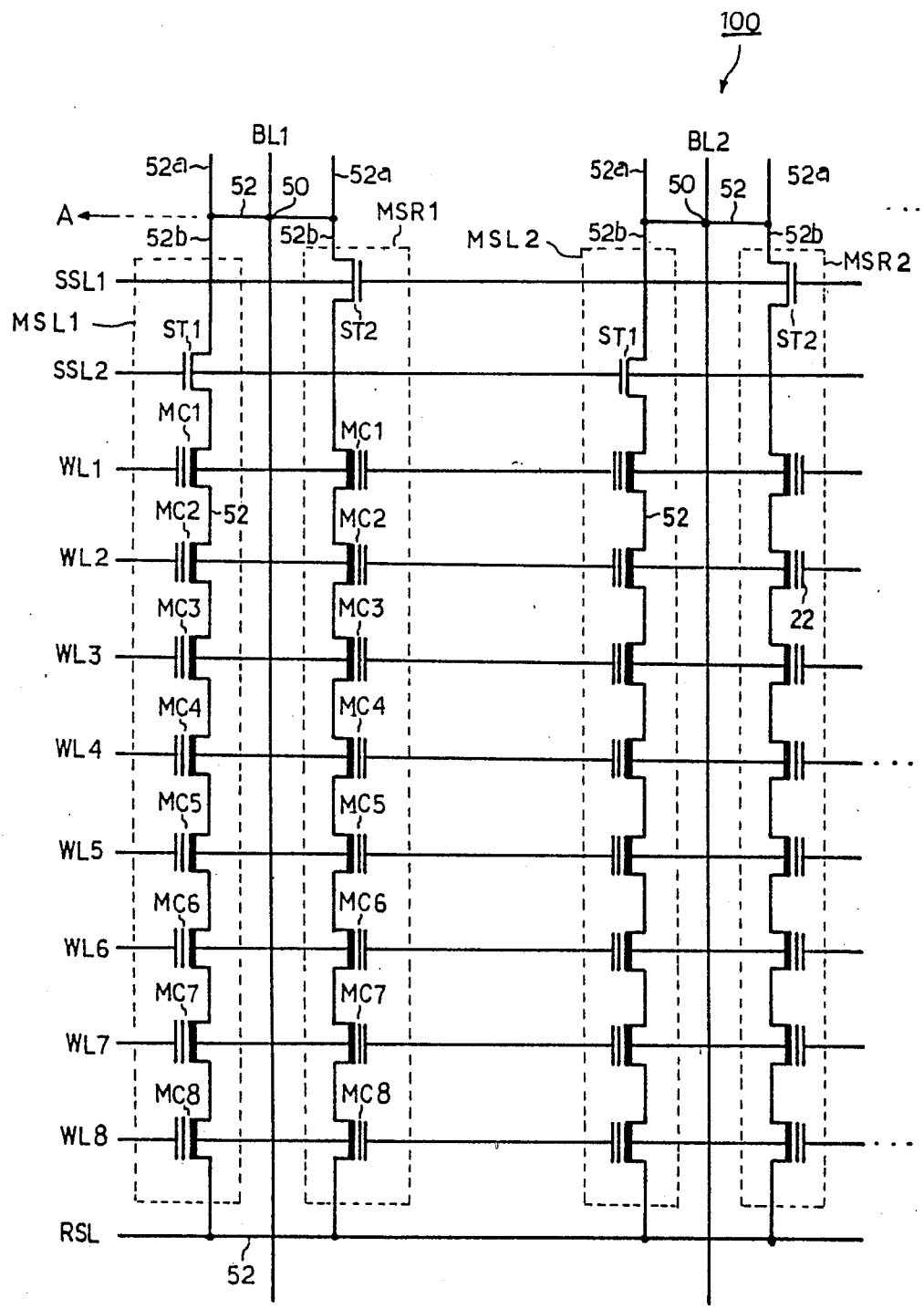
FIG. 2 is a schematic circuit diagram of a memory array of cells of an EEPROM device according to the present invention.
Figure 3:
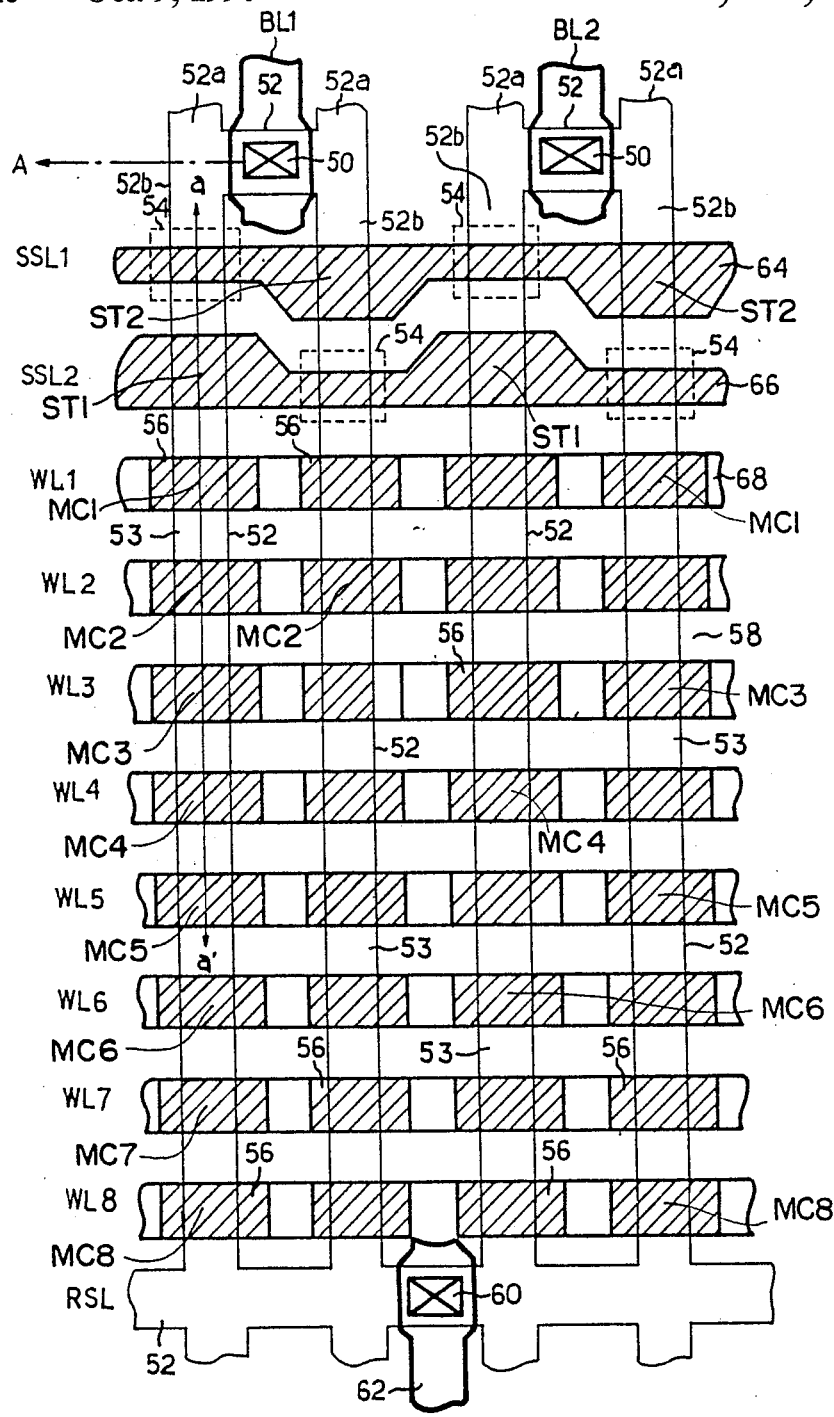
FIG. 3 is a layout arrangement view of FIG. 2.

Referring now to FIG. 2 and FIG. 3, there is shown a portion of memory array according to the present invention in which only four memory strings are illustrated. Memory array 100 comprises a plurality of memory strings MSL1 to MSLi and MSR1 to MSRi arranged in matrix form in mutually parallel rows and columns, wherein i is a positive integer. Each of memory strings MSL1 to MSLi comprises a first string select transistor ST1 having a drain, a source and a gate and 8-bit memory cells MC1 to MC8 whose each has a drain, a source, a floating gate and a control gate. Each of memory strings MSR1 to MSRi also comprises a second string select transistor ST2 having a drain, a source and a gate and 8-bit memory cells MC1 to MC8 each of which has a drain, a source, a floating gate and a control gate. All of memory cells have the same structures and size.

Figure 4:
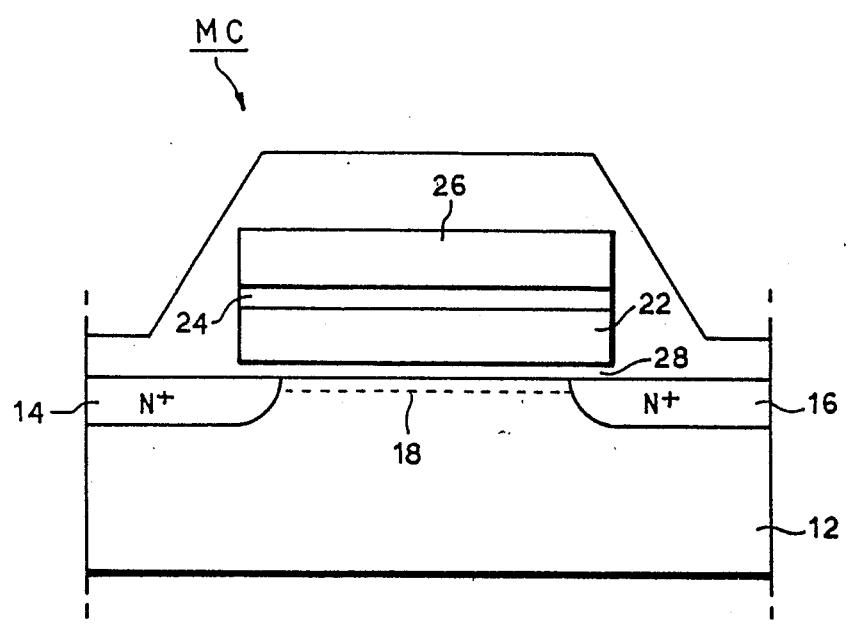
FIG. 4 is a cross-sectional view of a memory cell constituting the memory array according to the present invention.

Referring to FIG. 4, there is shown a cross-sectional view of the memory cell MC employed in the present invention. The memory cell MC may be more easily understood by various processing stages which are to explain with respect to FIG. 5a to FIG. 5f. The memory cell MC has a N+ doped drain region 14 and a N+ doped source region 16 which are spaced apart by a channel region 18 on the face of a P-type semiconductor substrate 12. The floating gate 22 formed of a first polycrystalline silicon is spaced apart by a gate oxide layer 28 of about 100 Å from the channel region 18. An interdielectric layer 24 of about 280 Å in thickness is formed between the floating gate 22 and a control gate 26. The control gate 26 formed of a second polycrystalline silicon is formed on the inter-dielectric layer 24. The channel region 18 is implanted by N-type impurities such as arsenic or phosphorus. Therefore, the memory cell MC is a depletion mode N-channel floating gate MOS transistor having an virgin threshold voltage Vto of $-2$ to $-5$ volts.

Turning to FIG. 2 and FIG. 3, bit lines (or column lines) BL1 to BLi which are vertically elongated metal strips on a thick oxide layer, respectively make in contact with N+ diffused region 52 in the P-type semiconductor substrate 12 through contact holes 50 in the thick oxide layer. Each N+ diffused region 52 is connected to drains of first and second select transistors ST1 and ST2 in the memory string pair MSLi and MSRi which are in parallel with the bit line BLi and locate underneath both sides of the line BLi.

Each source of first and second select transistors ST1 and ST2 is connected to the respective one of drains of memory cells MC1. Drain-source paths of memory cells MC1 to MC8 in each memory string are connected in series between a source of the transistor ST1 or ST2 and a reference source line RSL. Sources of memory cells MC8 are connected to the reference source line RSL which is a portion of the N+ diffused region 52. The reference source line RSL perpendicular to bit lines makes contact through contact holes 60 with common reference source lines 62 which are vertical metal strips between the bit line pair.

Interconnection regions 53 for serially connecting memory cells MC1 to MC8 in each memory string are portions of the N+ diffused region 52. Shaded regions 56 are areas of floating gates of memory cells MC1 to MC8 which are portions of the first polycrystalline silicon. A shaded region 64, defined by a line and a periodically varying line, is the first string select line SSL1 formed of the first polycrystalline silicon. Gates of transistors ST2 are portions of the first polycrystalline silicon. A shaded region 66 is the second string select line SSL2 formed of the first polycrystalline silicon. Gates of first string select transistors ST1 are portions of the first crystalline silicon. Dotted rectangular regions 54 underneath lines SSL1 and SSL2 are buried N+ regions which are formed on the face of the substrate 12 to transfer potential on the bit line to memory cells.

All of control gates in a row of memory cells are portions of a word line formed of the second polycrystalline silicon. For example, control gates 26 of memory cells MC1 in a row are parts of a word line WL1 which is a strip of the second polycrystalline silicon 68. In the same manner, control gates 26 of memory cells MC2 to MC8 are respectively portions of word lines WL2 to WL8 which are mutually parallel elongated second polycrystalline silicon strips overlying floating gate regions 56. Clear regions 58 represent thick or field oxide layer for isolating between memory cells.

Memory strings are mirrored to an axis A of row line. Therefore, each of N+ diffused regions 52 has a pair of upper N+ diffused regions 52a and a pair of lower N+ diffused regions 52b which respectively extend upward and downward in parallel with adjacent bit line. End portions of upper and lower N+ diffused regions 52a and 52b in the left side are connected to drains of first string select transistors ST1, while those in the right side are connected to drains of second string select transistors ST2. Therefore, since a single contact hole is shared with four memory strings through the N+ diffused region, the high density of memory array of EEPROM device could be achieved.

Erase, program and read operation will be discussed with reference to memory strings of FIG. 2.

Erase operation is performed for all of memory cells on a selected word line according to input address. That is, erase operation is performed in each row (page). For the convenience of explanation, erasing memory cells MC3 on a selected word line WL3 will be explained.

An erasing voltage Ve of 18 volts is applied to the selected word line WL3 and all of bit lines BL1 to BLi are gounded (0 volt). Simultaneously, a power supply voltage Vcc of 5 volts is applied to first and second string select lines SSL1 and SSL2 and all of unselected word lines WL1, WL2 and WL4 to WL8 to transfer the ground potential on the bit lines BL1 to BLi to drains of the selected memory cell MC3 and the reference source line RSL becomes floating. Therefore, all of the memory cells MC3 are erased to enhancement mode MOS transistors having threshold voltages of about 1 volt by F-N tunnelling of electrons from their drains to their floating gates.

Program operation of memory cells is performed in page. Program of a memory cell MC3 in the memory string MSL1 coupled to a selected bit ling BL1 will be explained. Ground potential is applied to a selected word line ML3, a program voltage Vpgm of 13 volts is applied to the selected bit line BL1, and a pass voltage Vpa is applied to the second string select line SSL2 and pass word line WL1 and WL2 between the line SSL2 and the selected word line WL3 to transfer the program voltage Vpgm to the drain of the selected memory cell MC3. Simultaneously, an erase inhibit voltage Vei of 4 volts is applied to unselected bit lines BL2 to BLi so as to prevent unwanted erase of memory cells MC1 and MC2 in unselected memory strings which are coupled to pass word lines WL1 and WL2. The power supply voltage Vcc is also applied to the first string select line SSL1. Therefore, the program voltage Vpgm applied to the selected bit line BL1 is not to be transferred by itself to the unselected memory string coupled to the selected bit line BL1, but voltages of Vcc-Vt is transferred to memory cells MC1 and MC2 in the memory string MSR1. Wherein Vt represents threshold voltages of string select transistors ST1 and ST2 and is 1 volt in the application for the present invention. Vcc-Vt is substantially equal to the erase inhibit voltage VRi. Therefore, since the erase inhibit voltage Vei is applied to drains of memory cells coupled to pass word lines in unselected memory strings, difference voltages between their floating gates and their drains may not be established as high as occurring F-N tunnelling of electrons. As a result, problem of erase or over-erase of unselected memory cells on the pass word lines could be avoided.

On the other hand, the program voltage Vpgm is applied to the drain of the selected memory cell MC3, thereby being programmed to a depletion mode MOS transistor having threshold voltage of about 3 to 5 volts by F-N tunnelling of electrons from its floating gate to its drain.

Power supply voltage Vcc is applied to unselected word lines WL4 to WL8 between the selected word line WL3 and the reference source line RSL. This provides an effect of preventing disturbance of erase of the memory cell MC4 below the selected memory cell MC3.

During the program operation, the reference source line RSL is floating. If the potential of the reference source line RSL increases as high as programming unselected memory cells coupled to the line RSL, such problem can be prevented by clamping the line RSL to about 5 volts.

Read operation of a memory cell MC3 in a selected memory string MSL1 will be explained. Such read operation may be accomplished by grounding a selected word line WL3, the reference source line RSL, an unselected first string select line SSL1 and unselected bit lines BL2 to BLi, applying the power supply voltage Vcc to a selected first string select line SSL2 and unselected word lines WL1, WL2 and WL4 to WL8, and applying a read voltage Vr of 3 volts from well known sense amplifier to a selected bit line BL1. When the memory cell MC3 held in an erased state, no current will flow on the bit line BL1. But, when the memory cell MC3 held in a programmed (or written) state, current will flow on the line BL1. Therefore, data in the memory cell MC3 may be read out by the current sensing of the sense amplifier.

The combination of voltages for above mentioned operation modes of the memory array is summarized in following Table.

| Voltage conditions for various operation modes of memory array | | | |
| --- | --- | --- | --- |
|  | erase | program | read |
| selected bit line | 0 | Vpgm | Vr |
| unselected bit lines | 0 | Vei | 0 |
| unselected string select line | Vcc | Vcc | 0 |
| select string select line | Vcc | Vpa | Vcc |
| selected word line | Ve | 0 | 0 |
| pass word lines between selected string select line and selected word line | Vcc | Vpa | Vcc |
| reference source line | Floating | Floating | 0 |
| unselected word line between selected word line and reference source line | Vcc | Vcc | Vcc |

As described above, since the memory array of the present invention employs N-channel floating gate MOS transistors of depletion mode as memory cells, it has various advantages as described below.

During a program operation, disturbance of memory cells may be prevented. That is, since the pass voltage Vpa is lower than the erase voltage Ve in the present invention, unwanted erase or over-erase for unselected memory cells on pass word lines during the program operation may be prevented.

During a program operation, since the erase inhibit voltage Vei is applied to unselected bit lines, over-erase of unselected memory cells on the pass word lines may be avoided.

Since the program voltage Vpgm and the pass voltage Vpa are low as compared with the prior art, the insulating burden between memory cells may be lighten, so that the scaling-down of the memory array could be achieved.

FIG. 5a through FIG. 5f is cross-sectional views taken along a line a—a' showing various processing steps.

The starting material is P-type silicon wafer having a <100> orientation and a resistivity of 5 to 50 Ω-cm.

Figure 5A:
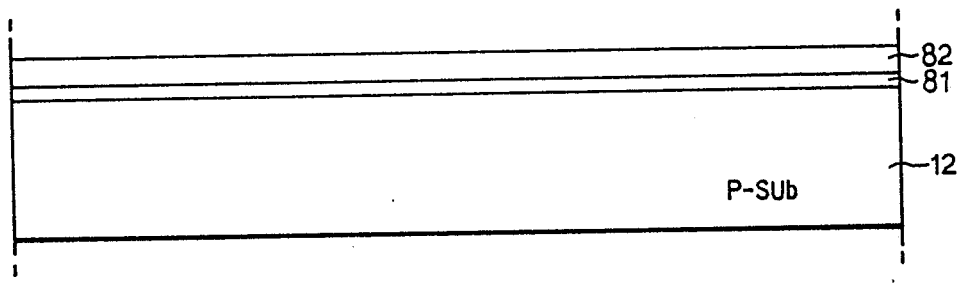

Referring to FIG. 5a, P-type substrate 12 may be the substrate of the starting material or a P-well formed in a N-type silicon wafer. A pad oxide layer 81 of about 400 Å is formed on the face of the substrate 12 and then a silicon nitride layer 82 of about 1500 Å is formed thereon. Subsequently, according to the conventional LOCOS process, a field region between memory strings is defined by a well known photolithography technique and then a field implantation for channel stopping and a field oxidation for forming a field oxide of about 7500 A is performed.

Figure 5B:
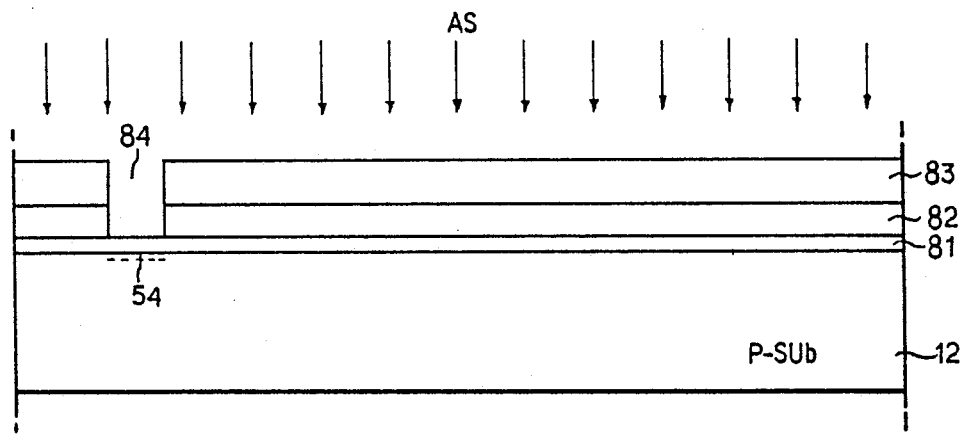

As seen in FIG. 5b, A mask layer 83 of photoresist with a hole 84 is formed on the field oxide layer and the silicon nitride layer 82 so as to function as a mask against ion implantation. The silicon nitride layer corresponding to the hole 84 is removed for implantation. Subsequently, N+ buried layer 54 is implanted with arsenic at 100 Kev and a dose of $1 \times 10^{15}/cm^2$. The mask layer 83, the silicon nitride layer 82 and the pad oxide layer 81 in the active region where memory strings and N+ diffused regions is formed are all removed.

Figure 5C:
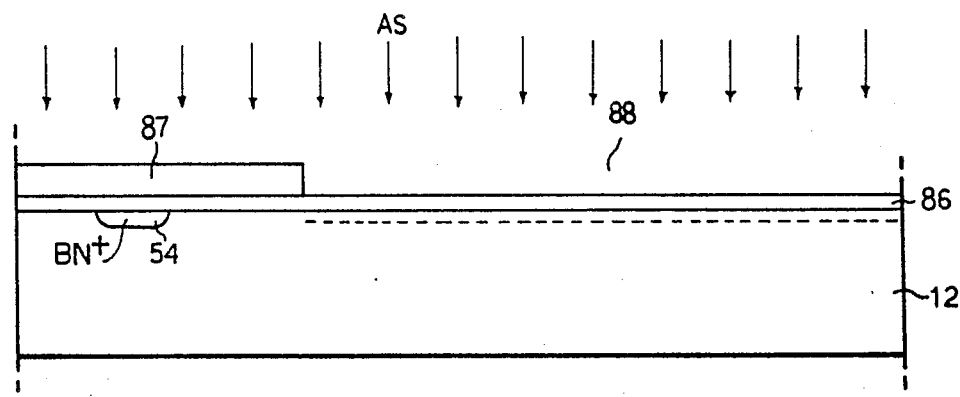

As shown in FIG. 5c, a gate oxide layer 86 of about 400 Å whose portions are to be used as gates of string select transistors ST1 and ST2 is formed on the face of substrate 12 by well known thermal oxidation and then the active region is implanted with boron at an energy of 50 Kev and a dose of $6 \times 10^{11}/cm^2$ to adjust the threshold voltage Vt of string select transistors ST1 and ST2. Subsequently, a second mask layer 87 is formed on the gate oxide layer 86 corresponding to the area where string select transistors ST1 and ST2 are formed for using as masking against ion implantation and then arsenic is implanted at 100 Kev and dose of about $3 \times 10^{12}/cm^2$ to adjust the virgin threshold voltage Vto to memory cells MC1 to MC8 in the range of $-2$ to $-5$ volts. After the implantation, both the oxide layer in the area 88 where memory cells are formed and the mask layer 87 are removed and then a thin gate oxide layer 28 for gates of memory cells MC1 to MC8 is formed at about 900° C. in the dry oxigen ambience to obtain the thickness of about 100 Å.

Figure 5D:
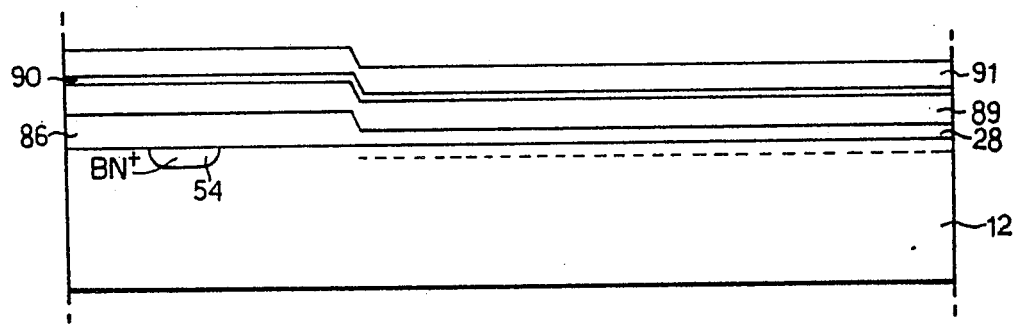

As seen in FIG. 5d, a first polycrystalline silicon layer 89 is formed by well known chemical vapor deposition (CVD) on the gate oxide layers 86 and 28, followed by being doped with a phosphorus so as to have a sheet resistance of about 50ΩΩ. Portions of the doped first polycrystalline silicon layer 89 are used as gates of string select transistors ST1 and ST2 and floating gates of memory cells MC1 to MC8. After doping, the interdielectric layer 90 of about 250 Å, which is composed of an oxide layer, a nitride layer and an oxide layer, is formed on the first polycrystalline silicon layer 89 and then a second polycrystalline silicon layer 91 of about 3000 Å is formed on the interdielectric layer 90, followed by being doped with a phosphorus so as to have a sheet resistance of about 20ΩΩ. If necessary, a tungsten silicide layer of about 2000 Å may be deposited on the second polycrystalline silicon layer 91 to increase the conductivity of the layer 91. Both control gates of memory cells MC1 to MC8 and word lines WL1 to WL8 are portions of the second polycrystalline silicon layer 91.

As seen in FIG. 5e, the second polycrystalline silicon layer 91, the interdielectric layer 90 and the first polycrystalline silicon layer 89 corresponding to holes 92 are removed and then arsenic is implanted at 75 Kev and a dose of $6 \times 10^{15}/cm^2$ to form an N+ diffused regions 52. After the implantation, a drive-in process is performed at about 975° C. for 30 minutes in a dry oxigen ambience to define the diffused regions 52.

As seen in FIg. 5f, an oxide layer 93 of about 1500 Å is deposited by the CVD and then BPSG layer 94 of about 7500 Å is deposited on the oxide layer 93. A reflow process of the BPSG layer 94 is performed for about 30 minutes at about 925° C. in an atmosphere of nitrogen to flatten the surface of the BPSG layer 94 so as to be suitable for a metalization process for the formation of bit lines. Contact holes 50 and 60 of FIG. 3 are formed by the conventional photo-etch technique and then metal is covered so as to make contacts to N+ diffused regions 52, followed by being patterned to bit lines BL1 to BLi and common vertical reference source lines 62. The string select lines SSL1 and SSL2 of first polycrystalline silicon forming gates of the first and second string select transistors ST1 and ST2 may be respectively contacted with the second polycrystalline silicon above the lines SSL1 and SSL2 to use other lines SSL1 and SSL2.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. An electrically erasable programmable semiconductor memory array, comprising:
    a plurality of column lines;
    a plurality of reference lines perpendicular to the column lines;
    a plurality of memory strings arranged in a single column respectively disposed at both sides of each column line and in an upper and a lower row disposed between each adjacent one of said reference lines, each of upper and lower memory strings at one side of each of said column lines including a first transistor having a drain, a source and a gate and a first plurality of floating gate transistors each having a drain, a source, a floating gate and a control gate, with drain-source paths of the first transistor and the floating gate transistors of said first plurality being connected in series, each of upper and lower memory strings at the other side of the column including a second transistor having a drain, a source and a gate and a second plurality of floating gate transistors, drain-source paths of the second transistor and the floating gate transistors of said second plurality being connected in series, the first and second transistors and the floating gate transistors being arranged in an array of rows and columns, gates of the first and second transistors and the floating gate transistors in the upper memory strings and the first and second transistors and the floating gate transistor in the lower memory strings being respectively connected to first and second select lines, each other upper word lines, third and fourth select lines and each other low word lines;
    means for connecting drains of the first and second transistors to the column line through a single contact hole;
    means for connecting the other ends of the serial connections in the upper memory strings to the reference line adjacent thereto; and
    means for connecting the other ends of the serial connections in the lower memory strings to the reference line adjacent thereto.

2. A memory array of claim 1 wherein each of the floating gate transistors is an N-channel floating gate MOS transistor of depletion mode.

3. A memory array of claim 2 wherein each of the first and second transistors is an N-channel MOS transistor of enhancement mode.

4. A memory array of claim 3 wherein the drains connecting means are portions of N+ diffused regions on the face of a P-type substrate made in contact with a column line through the contact hole.

5. A memory array of claim 4 wherein the reference lines are portions of the N+ diffused regions.

6. A memory array of claim 2 wherein the N-channel floating gate MOS transistor has a virgin threshold voltage of −2 to −5 volts.

7. A method of erasing all floating gate MOS transistors in a selected word line in a memory array having a plurality of memory strings arranged in rows of floating gate MOS transistors having drain-source paths connected in series between the source of the first transistor and a reference line, the drain of the first transistor being connected to the corresponding column line, gates of the first transistors in memory strings in the same row one of each being connected to a first line, control gates of the floating gate transistors in each row in the memory strings being connected to a word line, comprising the steps of:
    grounding all the column lines;
    applying power supplying voltage to the first line and unselected word lines in selected memory strings containing the selected word line;
    applying an erase voltage to the selected word line; and
    floating a selected reference line in the selected memory strings.

8. A method of claim 7 wherein each of the floating gate MOS transistors is an N-channel floating gate MOS transistor of depletion mode.

9. A method of claim 8 wherein the first transistor is an N-channel MOS transistor of enhancement mode.

10. A method of claim 9 wherein the power supply voltage is approximately 5 volts.

11. A method of programming a selected floating gate MOS transistor in a memory array having a plurality of memory strings arranged in rows and columns, each memory string having a first MOS transistor and a plurality of floating gate MOS transistors having drain-source paths connected in series between the source of the first transistor and a reference line, the drain of the first transistor being connected to the corresponding column line, gates of the first transistors in memory strings in the same one of each row being connected to a first line, control gates of the floating gate transistors in each row in the memory strings being connected to a word line, comprising the steps of:
    applying a program voltage to a selected column line;
    applying a pass voltage to a selected first line in memory strings containing the selected floating gate transistor;
    applying a reference source voltage to a selected word line connected to the selected floating gate transistor; and
    applying the pass voltage to an unselected word line between the selected first line and the selected word line wherein the pass voltage causes the selected first transistor and floating gate trasistor coupled to the selected column line and the unselected word line coupled to the selected column line and the unselected word line to turn on and is lower than the program voltage, although higher than the power supply voltage.

12. The method of claim 11 wherein each of the floating gate transistors is an N-channel floating gate MOS transistor of depletion mode and the first transistor is an N-channel MOS transistor of enhancement mode.

13. The method of claim 12, further including the step of applying an erase inhibit voltage to unselected bit lines wherein the erase inhibit voltage is one threshold voltage of the first transistor lower than the power supply voltage.

14. The method of claim 13, further including the step of applying the power supply voltage to unselected word lines between the selected word line and the reference line and floating the reference line.

15. Method of claim 14 wherein the power supply voltage is about five volts and the reference source voltage is at ground potential.

16. An electrically erasable programmable semiconductor memory array, comprising:
 a plurality of column lines;
 a plurality of reference lines perpendicular to the column lines;
 a plurality of memory strings arrange in a single column respectively disposed at both sides of each of said column lines and in an upper and a lower row disposed between each adjacent one of the reference lines, each of upper and lower memory strings at one side of each column including a first transistor having a drain, a source and a gate and a plurality of floating gate transistors each having a drain, a source, a floating gate and a control gate, drain-source paths of the first transistor and the floating gate transistors being connected in series, the first transistors and the floating gate transistors being arranged in an array of rows and columns, gates of the first transistors and the floating gate transistors in the upper memory strings and the first transistors and the floating gate transistor in the lower memory strings being respectively connected to first and second select lines and each other low word lines of each other; means for connecting drains for the first transistors to the column lines through a single contact hole;
 means for connecting the other ends of the serial connections in the upper memory strings to the reference line adjacent thereto; and
 means for connecting the other ends of the serial connections in the lower memory strings to the reference line 17. A memory array of claim 16, wherein each of the floating gate transistors is an N-channel floating gate MOS transistor of depletion mode.

18. A memory array of claim 17, wherein each of the first transistors is an N-channel MOS transistor of enhancement mode.

19. A memory array of claim 18, wherein the drains connecting means are portions of N+ diffused regions on the face of a P-type substrate made in contact with the column lines through the contact hole.

20. A memory array of claim 19, wherein the reference lines are portions of the N+ diffused regions.

21. A memory array of claim 16, wherein the N-channel floating gate MOS transistor has a virgin threshold voltage of −2 to −5 volts.

* * * * *